(12) United States Patent
Forster et al.

(10) Patent No.: US 9,373,485 B2
(45) Date of Patent: Jun. 21, 2016

(54) APPARATUS AND METHOD FOR IMPROVED DARKSPACE GAP DESIGN IN RF SPUTTERING CHAMBER

(71) Applicant: Applied Materials, Inc., Santa Clara, CA (US)

(72) Inventors: John C. Forster, Mt. View, CA (US); Xianmin Tang, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/618,416

(22) Filed: Feb. 10, 2015

(65) Prior Publication Data

US 2015/0155143 A1 Jun. 4, 2015

Related U.S. Application Data

(62) Division of application No. 12/723,187, filed on Mar. 12, 2010, now Pat. No. 8,992,747.

(51) Int. Cl.
| | |
|---|---|
| *B23K 31/02* | (2006.01) |
| *H01J 37/34* | (2006.01) |
| *C23C 14/34* | (2006.01) |
| *B23K 1/00* | (2006.01) |

(52) U.S. Cl.
CPC ........... *H01J 37/3491* (2013.01); *B23K 1/0008* (2013.01); *B23K 31/02* (2013.01); *C23C 14/3407* (2013.01); *H01J 37/3435* (2013.01); *H01J 37/3441* (2013.01); *H01J 2237/332* (2013.01); *Y10T 29/49826* (2015.01); *Y10T 29/49947* (2015.01)

(58) Field of Classification Search
None
See application file for complete search history.

(56) References Cited

U.S. PATENT DOCUMENTS

| | | | | |
|---|---|---|---|---|
| 4,604,180 A | | 8/1986 | Hirukawa et al. | |
| 4,874,494 A | | 10/1989 | Ohmi | |
| 5,009,765 A | * | 4/1991 | Qamar | C23C 14/3407 204/298.09 |
| 5,230,459 A | * | 7/1993 | Mueller | B23K 20/023 204/298.12 |
| 5,269,899 A | * | 12/1993 | Fan | C23C 14/3407 204/192.12 |
| 5,674,367 A | * | 10/1997 | Hunt | H01J 37/3435 204/298.12 |
| 5,857,611 A | * | 1/1999 | Gilman | C23C 14/3407 204/298.12 |
| 6,164,519 A | * | 12/2000 | Gilman | C23C 14/3407 228/107 |
| 6,190,513 B1 | | 2/2001 | Forster et al. | |
| 6,241,477 B1 | * | 6/2001 | Brezoczky | C23C 14/564 417/48 |

(Continued)

FOREIGN PATENT DOCUMENTS

| | | | | |
|---|---|---|---|---|
| WO | WO 0022185 A1 | * | 4/2000 | ........... B23K 20/023 |
| WO | WO 03100114 A1 | * | 12/2003 | ........... C23C 14/3407 |

(Continued)

OTHER PUBLICATIONS

Final Office Action in U.S. Appl. No. 12/723,187, dated Mar. 18, 2013, 10 pages.

(Continued)

*Primary Examiner* — Kiley Stoner
(74) *Attorney, Agent, or Firm* — Servilla Whitney LLC

(57) ABSTRACT

Improved designs of target assemblies and darkspace shields are disclosed. Methods of improving darkspace gap in sputtering chambers and sputtering chambers having an improved darkspace gap are also disclosed. Disclosed is a target assembly having a substantially coplanar backing plate and a target are vertically spaced from the darkspace shield.

8 Claims, 2 Drawing Sheets

(56) References Cited

U.S. PATENT DOCUMENTS

| | | | |
|---|---|---|---|
| 6,620,296 B2 | 9/2003 | Gogh et al. | |
| 6,725,522 B1 * | 4/2004 | Ivanov | B21K 25/00 204/298.12 |
| 6,749,103 B1 * | 6/2004 | Ivanov | B23K 31/02 204/298.12 |
| 6,774,339 B1 * | 8/2004 | Smathers | B23K 1/0008 219/121.17 |
| 7,097,744 B2 | 8/2006 | Liu et al. | |
| 2001/0050223 A1 | 12/2001 | Gopalraja et al. | |
| 2002/0162741 A1 * | 11/2002 | Gogh | C23C 14/3407 204/298.12 |
| 2002/0185372 A1 * | 12/2002 | Hunt | H01J 37/3491 204/298.12 |
| 2003/0178301 A1 * | 9/2003 | Lynn | C23C 14/3407 204/298.12 |
| 2003/0218054 A1 * | 11/2003 | Koenigsmann | B23K 20/023 228/115 |
| 2004/0020769 A1 * | 2/2004 | Ivannov | C23C 14/3407 204/298.12 |
| 2004/0035698 A1 * | 2/2004 | Ivanov | B23K 9/0026 204/298.12 |
| 2004/0056070 A1 * | 3/2004 | Ivanov | B23K 25/00 228/174 |
| 2004/0113364 A1 * | 6/2004 | Ivanov | C23C 14/3407 29/557 |
| 2005/0011749 A1 * | 1/2005 | Kachalov | H01J 37/3435 204/192.12 |
| 2005/0051606 A1 * | 3/2005 | Perrot | C23C 14/3407 228/193 |
| 2005/0067469 A1 * | 3/2005 | Facey | B23K 1/0016 228/245 |
| 2005/0115045 A1 * | 6/2005 | Koenigsmann | C23C 14/3407 29/446 |
| 2005/0263570 A1 * | 12/2005 | Koenigsmann | B23K 35/02 228/245 |
| 2005/0284746 A1 * | 12/2005 | Ivanov | C23C 14/3407 204/192.12 |
| 2006/0065517 A1 * | 3/2006 | Ivanov | B23K 20/021 204/192.12 |
| 2007/0056688 A1 * | 3/2007 | Kim | B24C 1/003 156/293 |
| 2008/0116066 A1 * | 5/2008 | Miyashita | C23C 14/3407 204/298.12 |
| 2008/0236738 A1 * | 10/2008 | Lo | C23C 14/3407 156/283 |
| 2008/0308416 A1 * | 12/2008 | Allen | C23C 14/3407 204/298.12 |
| 2009/0045051 A1 * | 2/2009 | Ferrasse | H01J 37/3414 204/298.13 |
| 2009/0127107 A1 * | 5/2009 | Chu | C23C 14/3407 204/298.12 |
| 2012/0305393 A1 * | 12/2012 | Ivanov | C23C 14/3407 204/298.13 |

FOREIGN PATENT DOCUMENTS

| | | | | |
|---|---|---|---|---|
| WO | WO 2004024972 A2 * | 3/2004 | | B23K 20/021 |
| WO | WO 2004094688 A1 * | 11/2004 | | C23C 14/3407 |

OTHER PUBLICATIONS

Final Office Action in U.S. Appl. No. 12/723,187, dated Mar. 13, 2014, 18 pages.

Non-Final Office Action in U.S. Appl. No. 12/723,187, dated Sep. 14, 2012, 12 pages.

Non-Final Office Action in U.S. Appl. No. 12/723,187, dated Oct. 4, 2013, 20 pages.

* cited by examiner

APPARATUS AND METHOD FOR IMPROVED DARKSPACE GAP DESIGN IN RF SPUTTERING CHAMBER

CROSS-REFERENCE TO RELATED APPLICATIONS

This application is a divisional under 35 U.S.C. §121 of U.S. application Ser. No. 12/723,187, filed Mar. 12, 2010, now U.S. Pat. No. 8,992,747, the disclosure of which is hereby incorporated by reference in its entirety.

FIELD OF THE INVENTION

Embodiments of the present invention generally pertain to the field of physical vapor deposition. More specifically, embodiments of the invention relate to a method and apparatus for providing a target design with improved control of darkspace gap within a physical vapor deposition chamber.

BACKGROUND

Sputtering is a physical vapor deposition (PVD) process in which high-energy ions impact and erode a solid target and deposit the target material on the surface of a substrate such as a semiconductor substrate, a specific example being a silicon wafer. In semiconductor fabrication, the sputtering process is usually accomplished within a semiconductor fabrication chamber also known as a PVD process chamber or a sputtering chamber.

A typical semiconductor fabrication chamber has a target assembly including disc-shaped target of solid metal or other material supported by a backing plate that holds the target. Material sputtered from the edges of the target may contribute to a non-uniform deposition of the material on the surface of a substrate within the PVD chamber. To promote uniform deposition, the PVD chamber may have an annular concentric metallic ring circumferentially surrounding the disc-shaped target, which is often called a darkspace shield. The gap between the inner surface of the darkspace shield and the circumferential surface of the target is typically referred to as the darkspace gap.

In many applications, it is preferred that the darkspace gap be kept large enough to inhibit or prevent electrical arcing between the target and the darkspace shield, which are often at different electrical potentials. On the other hand, it is often preferred that the darkspace gap be kept small enough to prevent PVD plasma ignition within the gap and also to reduce the amount of sputtered material entering the darkspace gap and depositing onto the circumferential surface of the target. Such depositions on the target edge may cause particle contamination on processed semiconductor wafers or other workpieces. To provide a suitable darkspace gap around the complete periphery of the target, proper alignment of the target and the darkspace shield is often needed. In prior sputtering chambers, the target and the darkspace shield are typically each aligned to the chamber body in which the target and darkspace shield are installed.

FIGS. 1 and 2 illustrate a prior art arrangement of a darkspace shield and a target assembly. FIG. 1 is a schematic, cross-sectional illustration of a prior art a semiconductor fabrication chamber 100 comprising a chamber body 102 and a substrate 104 supported by a substrate support 106 within the chamber body 102. A target assembly 111 includes a target 112 supported by a backing plate or backing plate 114. The target includes a face or sputterable area 120 of disposed in a spaced relationship with respect to the substrate support 106.

As shown in FIGS. 1 and 2, a darkspace shield 108 comprising a generally annular shaped metal ring extends circumferentially around the target 112 and defines a darkspace gap 116 between the darkspace shield 108 and the edge of the target 112. The darkspace shield 108 is held in place in the chamber by a darkspace shield support 110. In addition to the vertical darkspace gap 116, a horizontal darkspace gap 118 is defined between the darkspace shield 108 and the backing plate 114.

While various solutions have been proposed to improve alignment of components and control of the darkspace gap, for example the design described in U.S. Pat. No. 7,097,744, there is still a need for methods and apparatus for improving control of the darkspace gap in PVD chambers.

SUMMARY

Accordingly, one or more embodiments of the invention are directed to apparatus for energizing a plasma by RF power within a semiconductor fabrication system by to sputter material from a target onto a substrate, the apparatus comprising a semiconductor fabrication chamber having a wall, a target assembly including a backing plate having a back surface and an outer peripheral front face defining an inner peripheral edge and a target joined to the backing plate, the target having a sputterable target surface, the backing plate having a recessed area bounded by the inner peripheral edge and the target disposed in the recessed area so that the backing plate outer peripheral front face and sputterable target surface are substantially coplanar; an RF power source coupled to the target assembly; and a conductive darkspace shield positioned adjacent and vertically spaced from said target assembly defining a darkspace gap between the target assembly and the darkspace shield.

In a specific embodiment, the darkspace gap comprises a horizontal gap between the darkspace sheet and the sputterable target surface. In another specific embodiment, the target has an outer peripheral edge and the darkspace gap comprises a vertical space between the inner peripheral edge of the backing plate and the outer peripheral edge of the target. In one or more embodiments, the darkspace gap does not include a vertical gap.

In one or more embodiments, the vertical space is defined prior to installation of the target assembly in the chamber. In specific embodiments, the vertical gap does not change upon installation of the target assembly in the chamber.

Another embodiment of the invention pertains to a target assembly for use in an RF sputtering chamber comprising a backing plate having a back surface and an outer peripheral face and a target joined to the backing plate, the target having a sputterable target surface, the backing plate having a recessed area bounded by the outer peripheral front face and the target disposed in the recessed area so that the backing plate outer peripheral front face and sputterable target surface are substantially coplanar. In specific embodiments, the target has an outer peripheral edge and the recessed area is bounded an inner peripheral edge of the backing plate, and a vertical space between the inner peripheral edge of the backing plate and the outer peripheral edge of the target. In one or more embodiments, there is substantially no gap between the target and the recessed area. According to one embodiment, the vertical space is defined prior to installation of the target assembly in an RF sputtering chamber.

Another aspect of the invention pertains to a method for manufacturing a target assembly for use in an RF sputtering chamber comprising providing a backing plate having a back surface, a front peripheral face defining an inner peripheral edge and a recessed area having a shape bounded by the inner peripheral edge; providing a target having substantially the same shape as the recessed area, the target having an inner surface, a sputterable target surface and an outer peripheral edge; and joining the inner surface of the target to the inner peripheral face of the backing plate so that the sputterable target surface is substantially coplanar with the outer peripheral face.

In one or embodiments of the method, a space is provided between the outer peripheral edge of the target and inner peripheral edge of the backing plate to define a gap. In specific embodiments, no space is provided between the outer peripheral edge of the target and inner peripheral edge of the backing plate.

BRIEF DESCRIPTION OF THE DRAWINGS

A more particular description of the invention, briefly summarized above, may be had by reference to the embodiments thereof that are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Before describing several exemplary embodiments of the invention, it is to be understood that the invention is not limited to the details of construction or process steps set forth in the following description. The invention is capable of other embodiments and of being practiced or being carried out in various ways.

Figure 1:
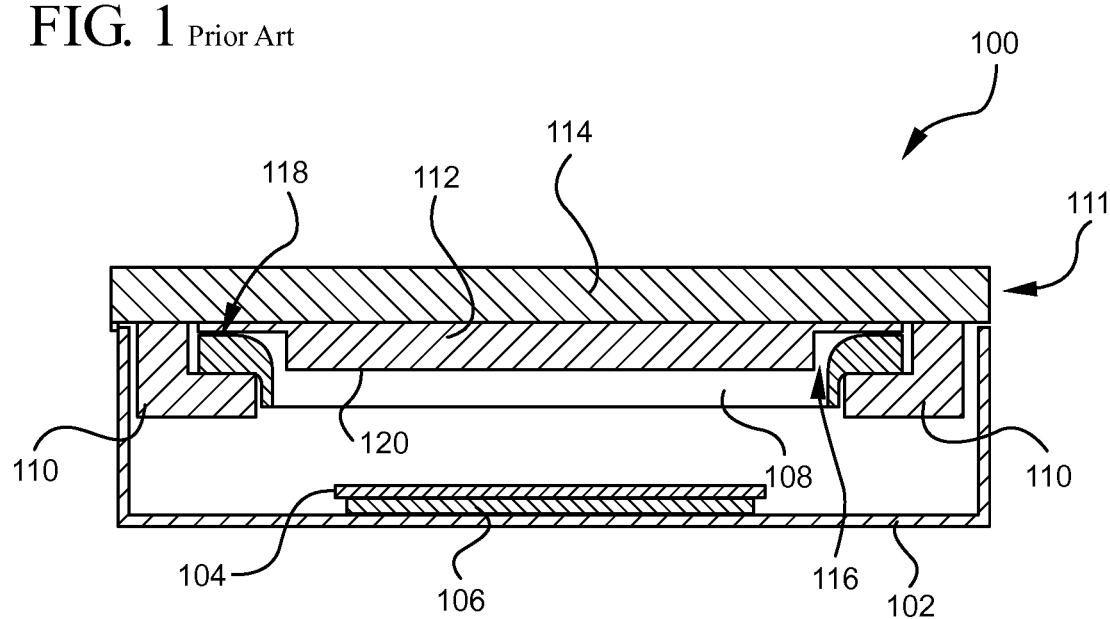
FIG. 1 is a schematic cross-sectional view of a prior art semiconductor fabrication chamber.
Figure 2:
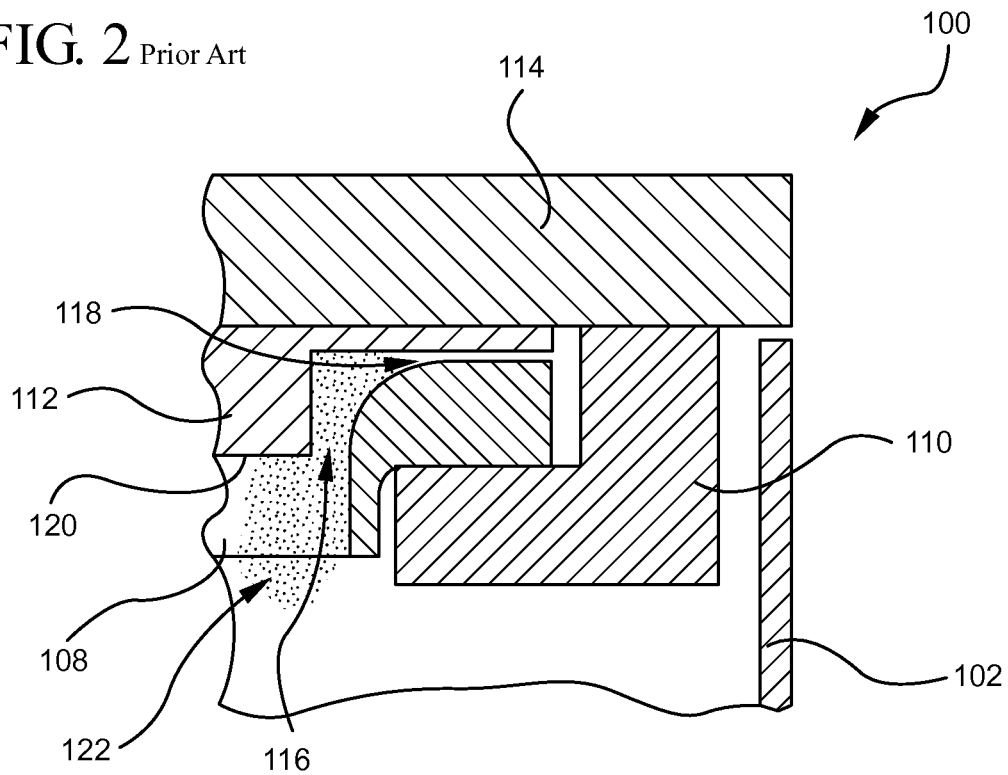
FIG. 2 is a partial, enlarged schematic cross-sectional view of a portion of a prior art semiconductor fabrication chamber.

As best seen in FIG. 2, lack of control of the width of the darkspace gap 116 in prior art target and shield designs can allow plasma 122 to penetrate into the darkspace gap, causing sputtering of backing plate 114 and/or darkspace shield 108 materials. This is believed to be less of a problem with DC PVD of conductors, since proper magnet design can limit plasma penetration into the gap. For radio frequency (RF) PVD, however, it is much more difficult to control the plasma penetration with a magnetic field. This penetration and sputtering of the backing plate and darkspace shield can lead to unacceptable contamination amounts in films, especially for metal gate applications. Reducing the size of the darkspace gap is difficult, because due to manufacturing tolerances, a larger gap size facilitates easy assembly and replacement of the target and darkspace shield.

Figure 3:
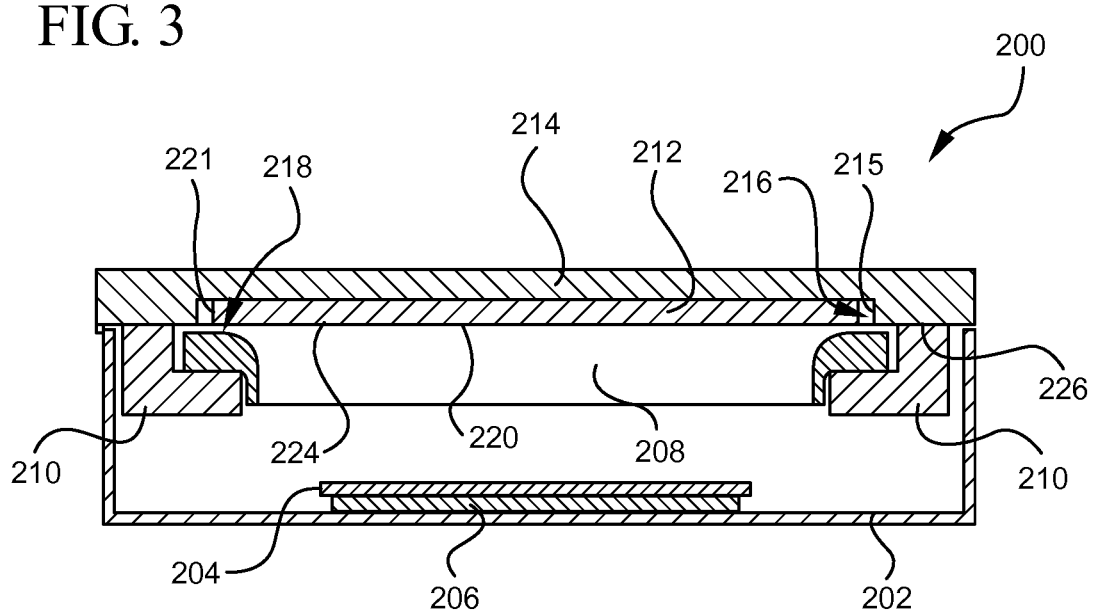
FIG. 3 is a schematic cross-sectional view of a semiconductor fabrication chamber in accordance with a first embodiment.

In accordance with one aspect of the present invention, a chamber with an improved darkspace shield and a target assembly arrangement is provided. FIG. 3 is a schematic, cross-sectional illustration of a semiconductor fabrication chamber 200 according to a first embodiment, comprising a chamber body 202 and a substrate 204 supported by a substrate support 206 within the chamber body 202. A target assembly 211 includes a target 212 supported by a backing plate 214. The target includes sputterable area 220 of disposed in a spaced relationship with respect to the substrate support 206.

It will be appreciated from FIG. 3 that backing plate 214 includes a recessed area defined by an outer peripheral front face 226 surrounding inner peripheral face 224. Specifically, the recessed area is bounded by an inner peripheral edge 215 of the backing plate. Thus, the thickness of the backing plate 214 is greater at the outer peripheral front face than at the inner peripheral face. In one or more embodiments, the recessed area will typically have the same shape as the target 212, and the target 212 is fitted into the recessed area. Thus, contrary to prior art designs, the sputterable area or face 220 of the target 212 lie in the same plane as the portion of the face of the backing plate, which is the outer peripheral front face 226, adjacent to the darkspace shield 208. Thus, the sputterable area or face of target 220 does not extend past the outer peripheral front face 226 of the backing plate 214. In other words, the area of the sputterable area 220 or face of the target 212 and the outer peripheral front face 226 of the backing plate are substantially flush or coplanar in the region adjacent darkspace shield 208.

Still referring to FIG. 3, the darkspace shield 208 comprises a generally annular shaped metal ring that extends circumferentially around the outer periphery of the face or sputterable area 220 of the target 212. However, since the target 212 is installed in the recess of the backing plate 214, so that the front face of the backing plate 214, and the sputterable area or front face 220 of the target 212 lie in the same plane. A vertical darkspace gap 216 is defined by a vertical space between the outer peripheral edge 221 of the target 212 material and the recess inner peripheral edge of the backing plate 214. This vertical backspace gap 216 represents the vertical portion of the darkspace. Since the vertical darkspace gap 216 is defined during target 212 and backing plate 214 manufacturing, tolerances can be kept much smaller than if the vertical darkspace gap is defined by the target and shield during installation as with current designs. Thus, the vertical darkspace gap 216 is defined prior to installation of the target assembly in the chamber, and the vertical gap does not change or remains constant upon installation of the target assembly in the chamber. In addition, the horizontal darkspace gap 218 of the darkspace is still defined by the target/shield gap, but in the new design, tolerances can be kept smaller, thus reducing the overall darkspace gap distance.

Figure 4:
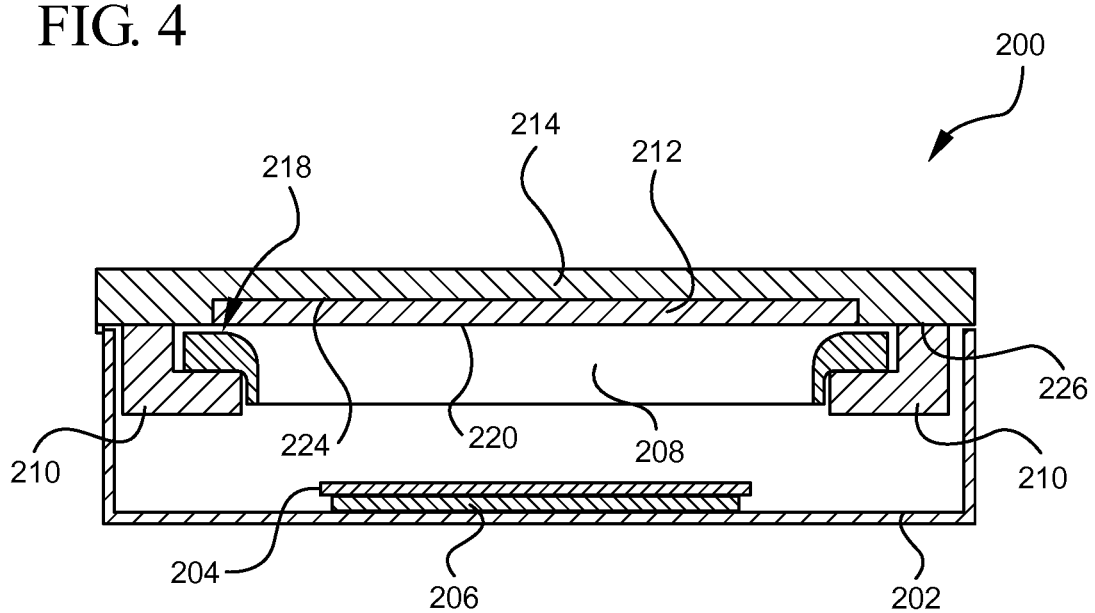
FIG. 4 a schematic cross-sectional view of a semiconductor fabrication chamber in accordance with a second embodiment.

Reference is now made to FIG. 4, which is a schematic, cross-sectional illustration of a semiconductor fabrication chamber 200 according to a second embodiment, comprising a chamber body 202 and a substrate 204 supported by a substrate support 206 within the chamber body 202. A target assembly 211 includes a target 212 supported by a backing plate or backing plate 214. The target includes sputterable area 220 of disposed in a spaced relationship with respect to the substrate support 206.

Like the embodiment shown in FIG. 3, the darkspace shield 208 comprises a generally annular shaped metal ring that extends circumferentially around the outer periphery of the face or sputterable area 220 of the target 212. However, since the target 212 is installed in the recess of the backing plate 214, so that the front face of the backing plate 214, and the sputterable area or front face 220 of the target 212 lie in the same plane. However, in the embodiment shown in FIG. 4, the vertical darkspace has been substantially eliminated, as the target 212 and backing plate 214 recesses are manufactured to a tolerance such that the target 212 snugly fits within the recess. Since the vertical darkspace gap 216 is eliminated, the problems mentioned above with respect to prior art designs are substantially reduced or eliminated. The horizontal darkspace gap 218 of the darkspace is still defined by the target/shield gap, but in the new design, tolerances can be kept smaller, thus reducing the overall darkspace gap distance.

Thus, by better controlling and/or eliminating the vertical darkspace gap, better control of full face erosion can be achieved. In the case of a film which does not suffer from stress related flaking, it would be possible to employ the design depicted in FIG. 4. The vertical gap shown in FIG. 3 can be utilized with a shield and magnet, to accurately define the radial extent of erosion. Thus, the darkspace gap can be made small enough to inhibit PVD plasma ignition within the darkspace gap to reduce the amount of sputtered material entering the darkspace gap.

It will be appreciated that the target is usually joined to the backing plate by welding, brazing, mechanical fasteners or other suitable joining techniques. The backing plate can be fabricated from a high strength, electrically conductive metal in electrical contact with the target. The target backing plate may also be formed together as a unitary or integral structure.

During operation of the semiconductor fabrication chamber the target and the backing plate 114 are often both electrically biased by a radio frequency (RF) power source at a high negative voltage to attract ions to the target sputter surface 220 to sputter material from the target 212. These ions impact the surface 220 of the target and eject the material of the target 212, atom by atom or in clusters of target material atoms. The sputtered metal deposits on the substrate 204 and forms a solid layer of metal. This layer may be patterned and etched or followed by bulk metal deposition to form interconnecting layers in a semiconductor wafer In contrast to the target 212, the darkspace shield 208 may be at earth potential, may be floating electrically or may be biased to a relatively small voltage. Therefore, there is typically a large potential difference between the target 212 and the darkspace shield 208. Consequently, the target 212 and backing plate 214 are usually electrically isolated from the darkspace shield 208 such that a direct electrical connection between darkspace shield and either the target or the backing plate through the chamber walls is often avoided. Such isolation may be provided by the shield support 210 which can electrically isolate the shield 208 from the chamber walls. Other isolators can be provided between the backing plate 214 and the chamber walls.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

What is claimed is:

1. A method for manufacturing a target assembly for use in an RF sputtering chamber comprising:
   providing a backing plate having a back surface, a front peripheral face defining an inner peripheral edge and a recessed area having a shape bounded by the inner peripheral edge;
   providing a target having substantially the same shape as the recessed area, the target having an inner surface, a sputterable target surface and an outer peripheral edge; and
   joining the inner surface of the target to the inner peripheral face of the backing plate so that the sputterable target surface is substantially coplanar with the outer peripheral face, and after joining a vertical darkspace gap comprising a vertical space is formed between the outer peripheral edge of the target and the inner peripheral edge of the recessed area of the backing plate.

2. A method for manufacturing a target assembly for use in an RF sputtering chamber comprising:
   installing a target comprising a sputterable target surface, a top surface, and an outer peripheral edge into a recess of a backing plate, wherein the backing plate comprises an outer peripheral front face, an inner peripheral face, an inner peripheral edge, and a top surface, wherein the recessed area is bounded by the inner peripheral edge and the inner peripheral face, and wherein the sputterable target surface and the outer peripheral front face lie in the same plane when installed, and wherein a completed target assembly comprises a vertical space between the outer peripheral edge of the target and the inner peripheral edge of the recessed area in the backing plate.

3. The method of claim 2, which further comprises joining the outer peripheral edge of the target to the inner peripheral face of the backing plate by welding, brazing, mechanical fastening, or a combination thereof.

4. The method of claim 2, wherein the recess of the backing plate completely surrounds the top surface and the outer peripheral edge of the target except for the sputterable target surface.

5. The method of claim 2, wherein the backing plate is fabricated from an electrically-conductive metal.

6. The method of claim 2, wherein the target has a shape substantially the same as a shape of the recessed area.

7. A method for manufacturing a target assembly for use in an RF sputtering chamber comprising:
   fabricating a unitary backing plate comprising an outer peripheral front face and a recessed area, wherein the recessed area is bounded by an inner peripheral edge and an inner peripheral face;
   installing a target comprising a sputterable target surface, a top surface, and an outer peripheral edge into the recessed area of the backing plate, wherein the target has a shape substantially the same as a shape of the recessed area, the target sized to form a vertical darkspace gap between the outer peripheral edge of the target and the inner peripheral edge of the recessed area in the unitary backing plate in a completed target assembly; and
   joining the outer peripheral edge of the target to the inner peripheral face of the backing plate by welding, brazing, mechanical fastening, or a combination thereof.

8. The method of claim 7, wherein the sputterable target surface and the outer peripheral front face of the unitary backing plate lie in the same plane.

\* \* \* \* \*